(12) United States Patent
Seok et al.

(10) Patent No.: US 8,741,709 B2
(45) Date of Patent: Jun. 3, 2014

(54) VERTICAL POWER MOSFET AND IGBT FABRICATION PROCESS WITH TWO FEWER PHOTOMASKS

(75) Inventors: Kyoung Wook Seok, Milpitas, CA (US); Jae Yong Choi, Seoul (KR); Vladimir Tsukanov, Palo Alto, CA (US)

(73) Assignee: IXYS Corporation, Milpitas, CA (US)

( * ) Notice: Subject to any disclaimer, the term of this patent is extended or adjusted under 35 U.S.C. 154(b) by 320 days.

(21) Appl. No.: 13/113,797

(22) Filed: May 23, 2011

(65) Prior Publication Data

US 2011/0312137 A1    Dec. 22, 2011

Related U.S. Application Data

(60) Provisional application No. 61/347,793, filed on May 24, 2010.

(51) Int. Cl.
*H01L 21/8238* (2006.01)

(52) U.S. Cl.
USPC ............ 438/223; 438/232; 438/299; 438/377

(58) Field of Classification Search
USPC ......... 438/223–225, 229, 231–232, 299, 301, 438/305, 306, 371–373, 377; 257/E21.632
See application file for complete search history.

(56) References Cited

U.S. PATENT DOCUMENTS

2003/0151092 A1 *  8/2003  Chien ........................... 257/341

\* cited by examiner

*Primary Examiner* — Thanhha Pham
(74) *Attorney, Agent, or Firm* — Imperium Patent Works; Amir V. Adibi (57) ABSTRACT

A process for fabrication of a power semiconductor device is disclosed in which a single photomask is used to define each of p-conductivity well regions and n-conductivity type source regions. In the process a single photomask is deposited on a layer of polysilicon on a wafer, the polysilicon layer is removed from first regions of the power semiconductor device where the p-conductivity well regions and the n-conductivity type source regions are to be formed, and both p-conductivity type and n-conductivity type dopants are introduced into the wafer through the first regions.

18 Claims, 8 Drawing Sheets

VERTICAL POWER MOSFET ELECTRON FLOW

VERTICAL POWER MOSFET AND IGBT FABRICATION PROCESS WITH TWO FEWER PHOTOMASKS

CROSS-REFERENCE TO RELATED APPLICATION

This application claims priority to U.S. Provisional Patent Application No. 61/347,793, filed May 24, 2010, which is incorporated by reference herein for all purposes.

BACKGROUND OF THE INVENTION

Its high switching speed, simple gate drive and wide safe operating area, have made vertical power MOSFETs a common switching device for modern power electronics. Because of its high current density, moderate switching speed, simple gate drive, and wide safe operating area, the IGBT is now also in widespread use for high power applications.

Figure 1:
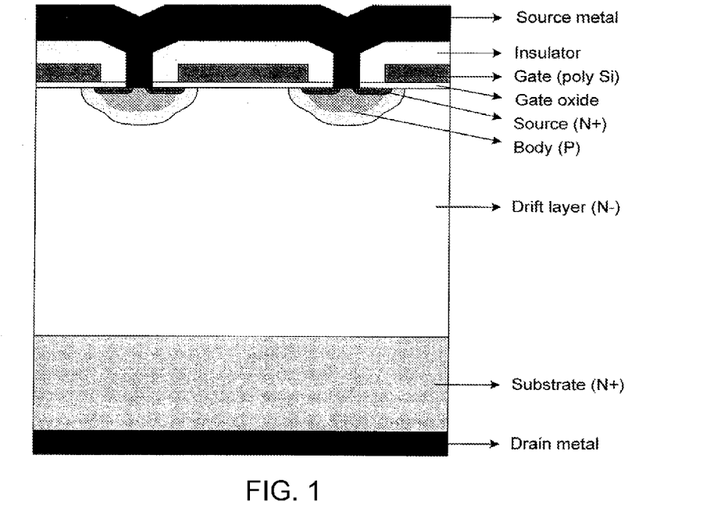
FIG. 1 illustrates the structure of typical vertical power MOSFET.
Figure 2:
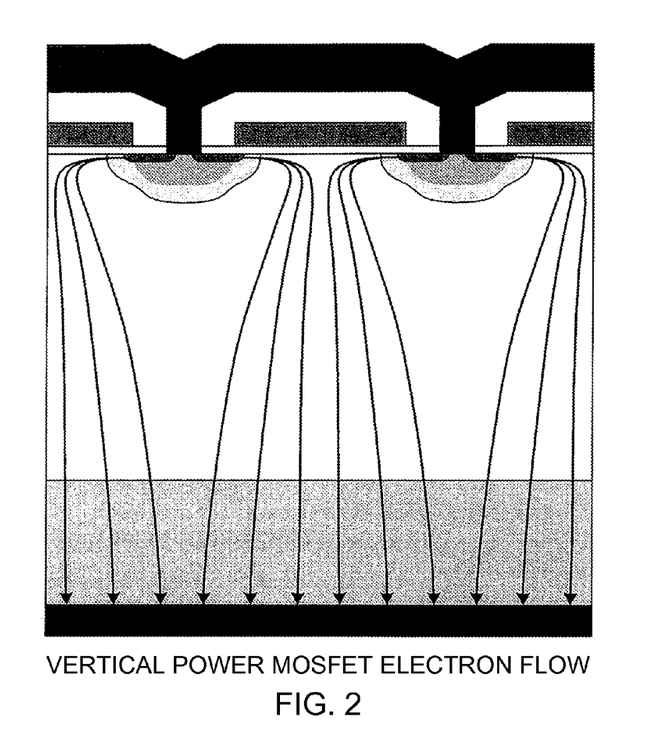
FIG. 2 illustrates electron flow in conduction state.

FIG. 1 illustrates a typical structure of vertical power MOSFET. The drain is at the bottom and the source is at the top. The current flows from bottom to top. Almost all of the area is used for current flow. The heat is dissipated through the entire bottom area, typically attached to a thick lead frame. In the blocking state, the voltage between the gate and the source is less than the threshold voltage and the N- drift layer holds the electric field. In the on-state, a positive voltage is applied between the gate and the source, allowing electron flow from source to the drain, as shown in FIG. 2.

Figure 3:
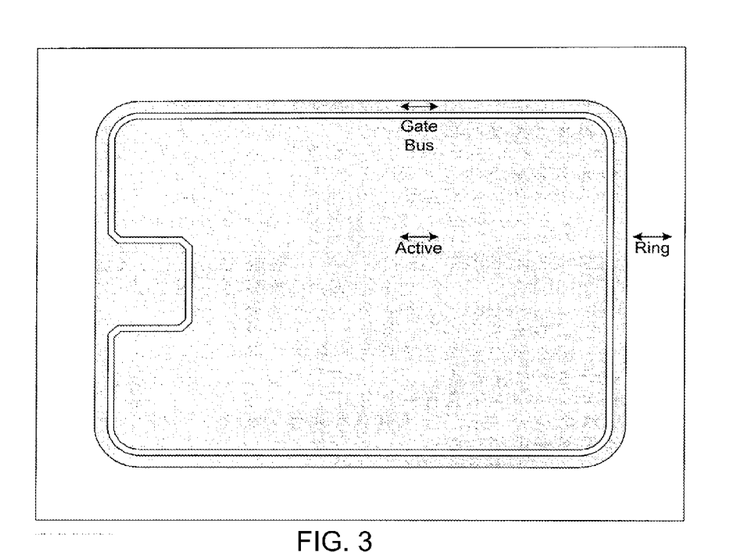
FIG. 3 is a top view of a typical vertical power MOSFET.

FIG. 3 shows a top view of a typical vertical power MOSFET. The shaded region is the metal layer. The central big metal region is the active area in which the top metal layer is connected to the body and source of MOSFET. The outer metal loop is known as the gate bus line and is for controlling the gate voltage. Outside of the gate bus line is the junction termination area or ring area. This is for sustaining the high voltage in the blocking mode.

Figure 4:
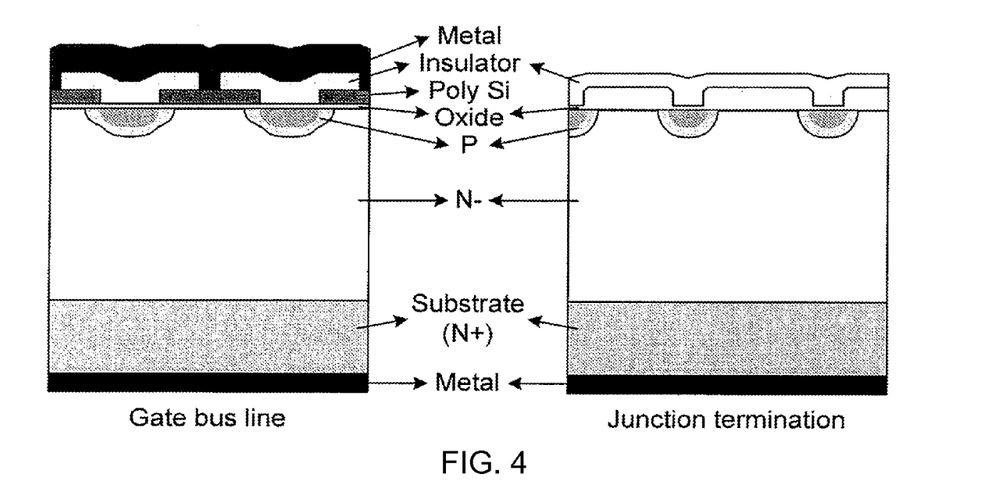
FIG. 4 illustrates the structure of a vertical power MOSFET.
Figure 51:
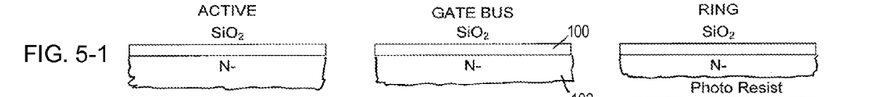

FIG. 4 shows the side view of the gate bus line and junction termination area. In the gate bus line area, the top metal is connected to the polysilicon gate. The polysilicon layer goes into the active area. In the junction termination area or ring area, there are P wells. As these P wells have a shape of a closed loop, they are often referred to as rings. These reduce the high electric field in the blocking mode, and make possible a high breakdown voltage.

BRIEF SUMMARY OF THE INVENTION

This invention provides a method for manufacturing such devices using two fewer photo masks in the fabrication process of vertical power MOSFETs and insulated gate bipolar transistors (IGBTs). In general, requiring a larger number of photo masks causes increased fabrication costs. This invention eliminates at least two masking steps from the typical fabrication process for the manufacture of vertical power MOSFET's and IGBTs. Prior art approaches to the manufacture of such devices typically required seven or more masking steps. Some of the steps required precise alignment with the underlying wafer. The complexity of the process increased the cost of manufacture of the devices, and the need for alignment reduced the yield of such devices.

In a preferred embodiment a process for fabrication of a vertical power MOSFET semiconductor device uses a single photomask to define the p-conductivity well regions and the n-conductivity type source regions. Preferably the single photomask is deposited on a layer of polysilicon on a wafer; the polysilicon layer is removed from first regions of the vertical power MOSFET semiconductor device where the p-conductivity well regions and the n-conductivity type source regions are to be formed; a p-conductivity type dopant is introduced into the wafer through the first regions to form the p-wells; the single photomask is removed; and then an n-conductivity type dopant is introduced into the wafer through the first regions to form the source regions.

In a further implementation following the step of introducing n-conductivity type dopant, the process further includes steps of forming a multipurpose photomask on the wafer to overlie regions of the polysilicon layer which remain on the wafer, the polysilicon layer having an upper surface and having sidewalls, the multipurpose photomask overlying both the upper surface and the sidewalls, but leaving portions of the wafer exposed between the sidewalls. Then a step of implanting p-conductivity type impurity through the portions of the wafer exposed between the sidewalls is performed, and the wafer is etched at locations where the portions of the wafer are exposed between the sidewalls.

BRIEF DESCRIPTION OF THE DRAWINGS

FIG. 5-1 illustrates thick oxide deposition on N- silicon;
FIG. 5-2 illustrates defining the ring photo mask;
FIG. 5-3 illustrates oxide etching;
FIG. 5-4 illustrates photoresist removal;
FIG. 5-5 illustrates gate oxide growth;
FIG. 5-6 illustrates JFET implantation;
FIG. 5-7 illustrates JFET diffusion;
FIG. 5-8 illustrates polysilicon deposition and n-type doping of it;
FIG. 5-9 illustrates the poly photomask;
FIG. 5-10 illustrates etching of the polysilicon;
FIG. 5-11 illustrates p-well implantation;
FIG. 5-12 illustrates removal of the photoresist;
FIG. 5-13 illustrates the p+ dopant photomask;
FIG. 5-14 illustrates the p+ implantation;
FIG. 5-15 illustrates removal of the photoresist;
FIG. 5-16 illustrates diffusion of the p-well;
FIG. 5-17 illustrates the strongly doped n-type photomask;
FIG. 5-18 illustrates the strongly doped n-type implantation;
FIG. 5-19 illustrates removal of photoresist;
FIG. 5-20 illustrates deposition of an insulation layer;
FIG. 5-21 illustrates annealing to smooth the insulation layer surface and diffuse the strongly doped n-type impurity;
FIG. 5-22 illustrates defining a contact photomask;
FIG. 5-23 illustrates etching of the insulation layer;
FIG. 5-24 illustrates removal of the photoresist;
FIG. 5-25 illustrates metal deposition;
FIG. 5-26 illustrates defining the metal photomask;
FIG. 5-27 illustrates etching of the metal;
FIG. 5-28 illustrates removal of photoresist;
FIG. 6-1 illustrates forming the gate oxide on an n-type silicon substrate;
FIG. 6-2 illustrates JFET Implantation;
FIG. 6-3 illustrates diffusion of the JFET implantation;
FIG. 6-4 illustrates deposition of the polysilicon and n-type doping;
FIG. 6-5 illustrates defining the polysilicon photomask;
FIG. 6-6 illustrates etching of the polysilicon;

FIG. 6-7 illustrates p-well implantation;
FIG. 6-8 illustrates removal of photoresist;
FIG. 6-9 illustrates diffusion of the p-well;
FIG. 6-10 illustrates strongly doped n-type implantation;
FIG. 6-11 illustrates defining the multipurpose photomask;
FIG. 6-12 illustrates strongly doped p-type implantation;
FIG. 6-13 illustrates etching of the polysilicon;
FIG. 6-14 illustrates etching of the silicon oxide;
FIG. 6-15 illustrates a shallow silicon etching process;
FIG. 6-16 illustrates removal of photoresist;
FIG. 6-17 illustrates deposition of an insulation layer;
FIG. 6-18 illustrates annealing to smooth the insulation layer surface and diffuse the strongly doped n-type and p-type impurities;
FIG. 6-19 illustrates formation of a contact photomask;
FIG. 6-20 illustrates etching the insulation layer;
FIG. 6-21 illustrates removal of photoresist;
FIG. 6-22 illustrates metal deposition;
FIG. 6-23 illustrates defining a metal photomask;
FIG. 6-24 illustrates metal etching;
FIG. 6-25 illustrates removal of photoresist;
FIG. 7-1 illustrates a step of Gate oxide grow on N− silicon;
FIG. 7-2 illustrates JFET Implantation;
FIG. 7-3 illustrates diffusion of the JFET implantation;
FIG. 7-4 illustrates deposition of the polysilicon and n-type doping;
FIG. 7-5 illustrates defining the polysilicon photomask;
FIG. 7-6 illustrates etching of the polysilicon;
FIG. 7-7 illustrates p-well implantation;
FIG. 7-8 illustrates removal of photoresist;
FIG. 7-9 illustrates diffusion of the p-well;
FIG. 7-10 illustrates implantation of strongly doped p-conductivity type impurity;
FIG. 7-11 illustrates implantation of strongly doped n-conductivity type impurity;
FIG. 7-12 illustrates defining the multipurpose photomask;
FIG. 7-13 illustrates etching of the polysilicon;
FIG. 7-14 illustrates etching of the silicon oxide;
FIG. 7-15 illustrates a shallow silicon etching process;
FIG. 7-16 illustrates removal of photoresist;
FIG. 7-17 illustrates deposition of an insulation layer;
FIG. 7-18 illustrates annealing to smooth the insulation layer surface and diffuse the strongly doped n-type and p-type impurities;
FIG. 7-19 illustrates formation of a contact photomask;
FIG. 7-20 illustrates etching the insulation layer;
FIG. 7-21 illustrates removal of photoresist;
FIG. 7-22 illustrates metal deposition;
FIG. 7-23 illustrates defining a metal photomask;
FIG. 7-24 illustrates metal etching; and
FIG. 7-25 illustrates removal of photoresist.

DETAILED DESCRIPTION OF THE INVENTION

A typical fabrication process for vertical power MOSFETs and IGBTs has 7 masks. The [Ring] mask defines the junction termination rings. The [Poly] mask defines the poly silicon gate and P well. The [P+] mask defines the highly doped region in the P well. The [N+] mask defines the source. The [Contact] mask defines the metal contacts for source and gate. The [Metal] mask shapes the source metal and gate bus line. The [Pad] mask is used for passivation, and is sometimes omitted.

This invention provides a fabrication process having 2 fewer photo masks than the typical conventional process. The first mask [Poly] defines the silicon gate, P well and junction termination ring. The second mask [Multipurpose] plays an important role of this invention. This mask eliminates unnecessary polysilicon in the junction termination area causing its removal. It also defines the N+ source, and the highly doped region in P well. From [Contact] mask, this process is similar to the conventional process.

This invention is explained below with N channel vertical power MOSFET. But, it can be applied to P channel vertical power MOSFETs or IGBTs in both N channel and P channel implementations.

FIG. 5 shows the typical fabrication steps for N-channel vertical power MOSFET. From 1) to 28), 6 photo masks are used. Detail minor steps were omitted.

FIG. 5 illustrates a prior art fabrication process for an N channel vertical power MOSFET. The columns in FIG. 5 illustrate the effect of the particular process step described on the labeled region of the wafer. In particular, the columns of FIG. 5 can be related to the top view of the semiconductor device shown in FIG. 3 in which the 3 regions-active, gate bus, and ring-are labeled. The direction of the arrows in FIG. 3 illustrates the "cut-line" for the cross sectional appearance of that linear region of the chip as illustrated in FIG. 5.

Figures 52, 53, 54:
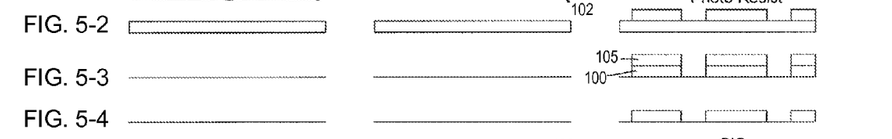

The process begins with formation of a silicon dioxide insulating layer 100 on the upper surface of the lightly doped n-conductivity type layer 102. A photoresist layer 105 is deposited across the upper surface of the silicon dioxide 100, and removed from regions where the silicon dioxide layer 100 is desired to be etched away. This is shown in FIG. 5-2.

As shown by FIG. 5-3, using conventional wet or dry etching, the silicon dioxide layer is removed from the portions of the substrate 102 where the silicon dioxide is unprotected by the photoresist layer 105. Following that step, the photoresist is removed as shown in FIG. 5-4.

Figure 55:
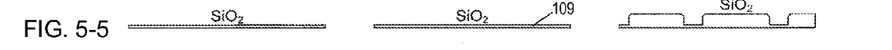
Figure 56:
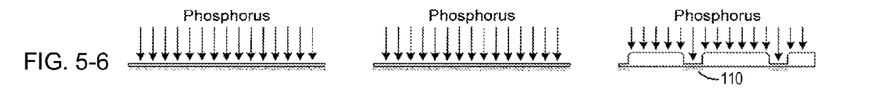
Figure 57:
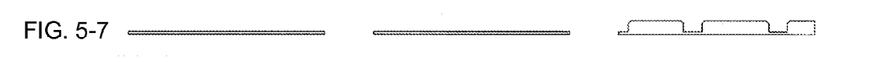

Next, as shown in FIG. 5-5, a thin layer of silicon dioxide 109 which will ultimately provide the gate insulating layer is formed across the upper surface of the wafer, preferably by heating the wafer to oxidize the underlying silicon. Next, a phosphorus implantation step is performed and the impurity diffused into the upper surface of the underlying silicon. The resulting doped regions 110 will have a slightly higher concentration of phosphorus near the surface. This will reduce the parasitic JFET resistance. Although this will reduce the avalanche breakdown voltage slightly, it also reduces the on-resistance of the MOSFET, enabling better performance. The implantation step is illustrated in FIG. 5-6.

Figure 58:
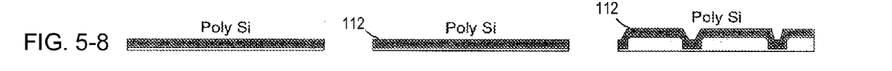

Following the diffusion, a layer of polycrystalline silicon 112 is deposited across the upper surface of the structure, as illustrated in FIG. 5-8. This layer is doped n-conductivity type in a conventional manner.

Figure 59:
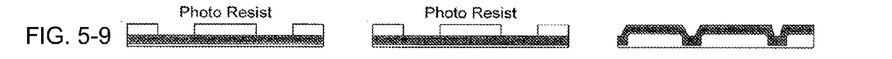
Figure 510:
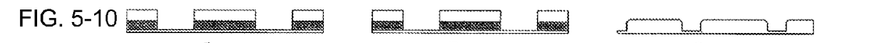

As shown by FIG. 5-9, another photoresist mask is formed on the upper surface of the polycrystalline silicon layer 112 and appropriately patterned using conventional photolithographic techniques. Once the undesired photoresist is removed, the mask will appear as shown in FIG. 5-9. As then shown in FIG. 5-10, the exposed polycrystalline silicon is etched away to create the structure depicted there. This etching step is conventional, and can also be a wet or dry procedure, for example, an acid etch or a plasma etch.

Figure 511:
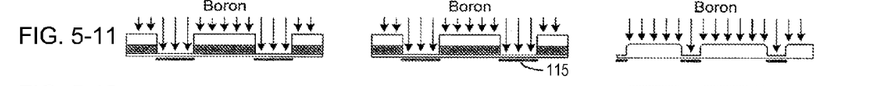

Following the etch, boron is implanted into the structure to create the desired p-conductivity type wells 115, as shown by FIG. 5-11.

Figure 512:
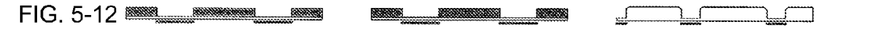
Figure 513:
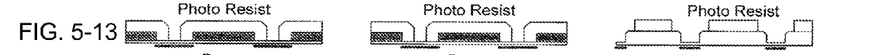

As shown by FIGS. 5-12 and 5-13, the photoresist mask is removed, and the new layer of photoresist deposited and patterned to create the structure illustrated in FIG. 5-13. Note that the photoresist protects the sidewalls of the silicon dioxide, reducing the size of the opening to the previously implanted P well regions.

Figure 514:
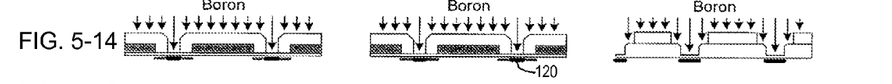
Figure 515:
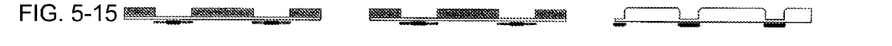
Figure 516:
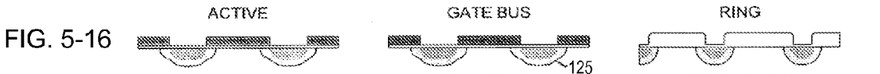

FIG. 5-14 illustrates the next step of the process in which a heavily doped boron implantation is performed to create strongly doped regions 120 in the substrate. Following this step, the photoresist is removed as shown in FIG. 5-15. Next, the substrate heated to diffuse the strongly doped p-conductivity type regions into the substrate, as illustrated by FIG. 5-16. This step is referred to as the p-well drive in operation. It results in the formation of the more strongly doped p-conductivity type wells 125.

Figure 517:
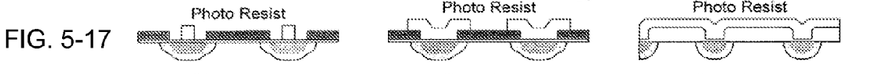
Figure 518:
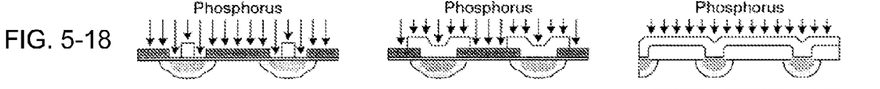

Following this step another photomask is deposited and defined across the upper surface of the integrated circuit. This photoresist mask will define n-conductivity type regions in the substrate in the subsequent process operation. As shown by FIG. 5-18, a strongly doped n-conductivity type implantation is performed next. Phosphorus, or other suitable n-conductivity type impurity is then implanted into the wafer, as shown by FIG. 5-18.

Figure 519:
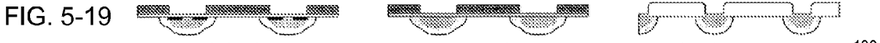
Figure 520:
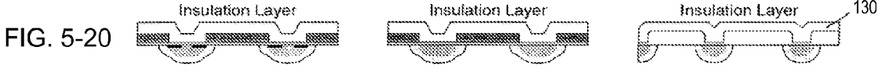
Figure 521:
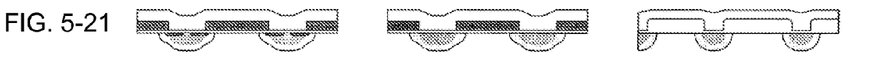

The photoresist is then removed as shown by FIG. 5-19, and a layer of insulating material, preferably silicon dioxide, is deposited across the chip as shown by FIG. 5-20. Following this step an annealing process is carried out to smooth the layer of insulating material and diffuse deeper into the wafer the strongly doped n-conductivity type impurity. This step is shown in FIG. 5-21.

Figure 522:
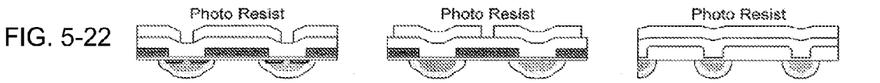
Figure 523:
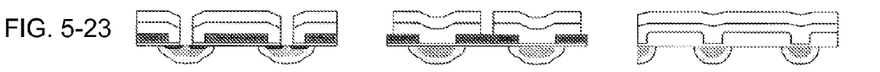
Figure 524:
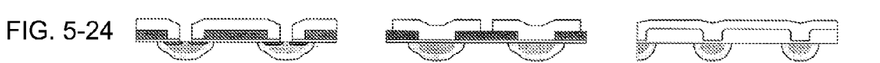
Figure 525:
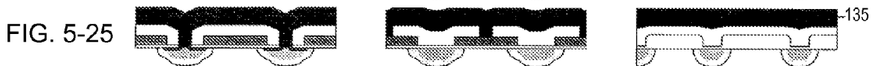
Figure 526:
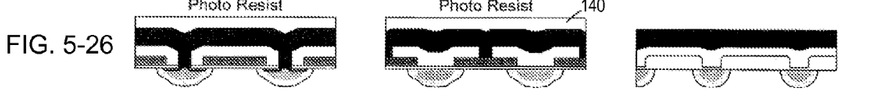
Figure 527:
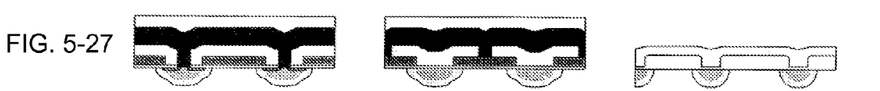
Figure 528:
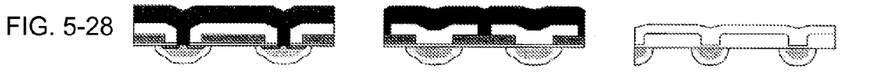

Next, another photoresist layer is deposited across the upper surface of the structure and patterned to define locations for electrical contacts. See, FIG. 5-22. The insulating layer and underlying silicon dioxide is then etched to remove it to define the locations for the electrical contacts.

Following this procedure, as shown by FIG. 5-24 the photoresist layer is removed, and then shown by FIG. 5-25 a metal deposition is performed to provide the contact metal 135. After deposition of the metal, another photoresist layer 140 is deposited across the surface of the wafer and patterned to define the metal contacts. A metal etching step is performed to define the locations of the metal contacts on the chip. Finally, shown in FIG. 5-28, the photoresist is removed, leaving the desired metal interconnection pattern. After photo resist remove of FIG. 5-28, there may be photo mask step for passivation which covers the junction termination area and the gap between source metal and gate bus line metal, however some manufacturers omit this step.

Note with regard to this process that in FIG. 5-6 and FIG. 5-7, light dose of phosphorus is implanted and diffused. This makes slightly higher concentration of phosphorus near the surface. As this reduces parasitic JFET resistance, it is called as 'JFET implantation'. Though it reduces the avalanche breakdown voltage slightly, it reduces much on-resistance of MOSFET. In overall, it helps the MOSFET has better performance. Depending on the manufacturer, implantation can be after FIG. 5-3) or FIG. 5-4). The JFET diffusion can be omitted or at some location before FIG. 5-9).

The additional Boron implantation with [P+] mask increases the Boron density beneath the N+ source. It reduces the parasitic resistance and suppresses the parasitic NPN bipolar transistor turn-on. It makes the MOSFET rugged. It also makes better contact between source metal and body.

Fine alignments of [P+] to [Poly], [N+] to [Poly] and [Contact] to [Poly] are required. [Poly] to [Ring] and [Metal] to [Contact] do not require fine alignment.

FIG. 6 shows the process steps in a preferred embodiment of our invention. This process has 2 masks less than the process of FIG. 5. Moreover, the new process requires 2 masks to be aligned precisely, while the typical process requires 3 masks to be precisely aligned.

Unlike the typical process, the junction termination rings are made by [Poly] mask. The second [Multipurpose] mask eliminates the unnecessary poly layers in junction termination area. Unlike the typical process, N+ is implanted without mask. With [Multipurpose] mask, unnecessary N+ area is etched out from the top of Silicon. In FIG. 6, P+ is implanted with [Multipurpose] mask. So, [Multipurpose] mask replaces 3 masks [Ring], [P+] and [N+] of typical fabrication process.

Figure 61:
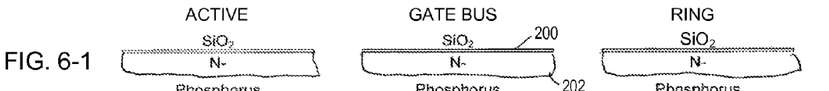

FIGS. 6-1 to 6-25 illustrate an improved fabrication process in which fewer masks are required. As shown by FIG. 6-1, the process begins by forming a thin layer of gate oxide 200, typically silicon dioxide formed by heating the substrate, on the upper surface of the substrate 202.

Figure 62:
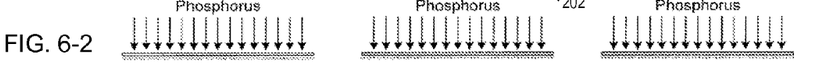
Figure 63:
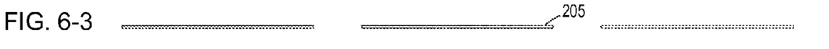
Figure 64:
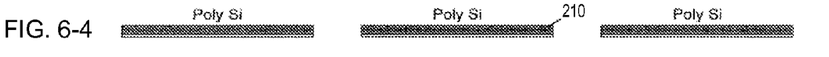

Next, as shown by FIG. 6-2 the JFET phosphorus implantation step is performed and diffused into the wafer to form regions 205. As shown by FIG. 6-4, a layer of polycrystalline silicon 210 is then deposited across the upper surface of the wafer.

Figure 65:
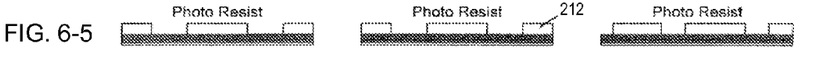
Figure 66:
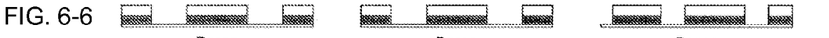
Figure 67:
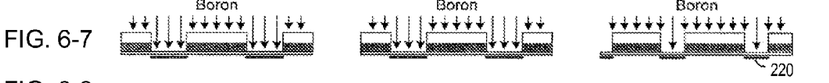

Next, a layer of photoresist 212 is deposited and patterned to define regions which will later be doped with p-conductivity type impurity. The appearance of the photoresist mask 212 is shown in FIG. 6-5. Using the mask, as shown in FIG. 6-6, the polycrystalline silicon layer 210 is etched from the exposed regions unprotected by the photoresist 212.

Figure 68:
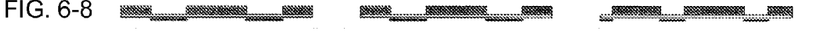
Figure 69:
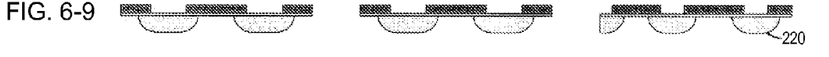
Figure 71:
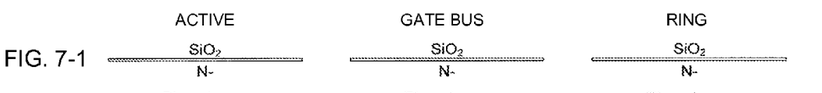
Figure 72:
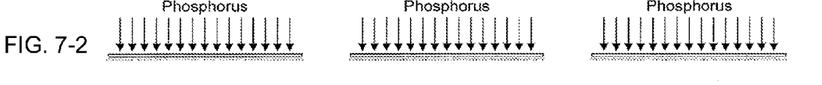
Figure 73:
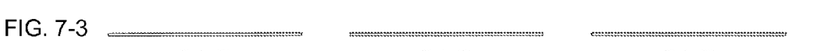
Figure 74:
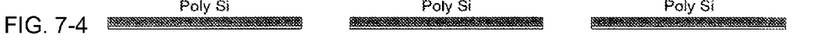
Figure 75:
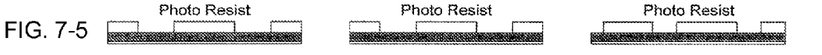
Figure 76:
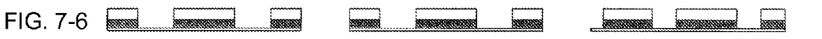
Figure 77:
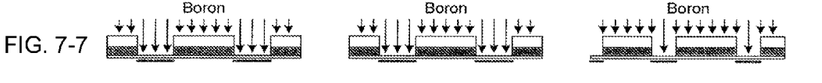
Figure 78:
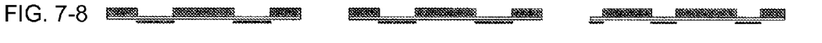
Figure 79:
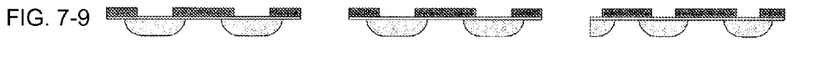

A boron implantation operation is then carried out by which boron impurity is introduced across the upper surface of the wafer, resulting in its implantation into the wafer in the regions unprotected by the masking layers. These boron regions will define the p-conductivity type wells 220 in the substrate. Next as shown by FIG. 6-8, the photoresist is removed and the structure heated to drive the p-well dopant deeper into the substrate to form wells 220. See FIG. 6-9.

Figure 610:
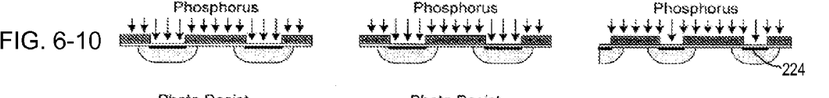

Following this step, shown in FIG. 6-10 a phosphorus implantation is made through the same openings to define n-conductivity type regions 224 in the p-conductivity type wells. Note that a single masking step defined both the regions for each of the boron and phosphorus implantation operations.

Figure 611:
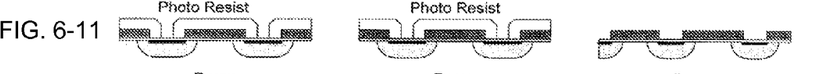
Figure 612:
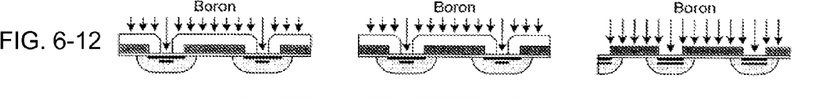

FIG. 6-11 illustrates the next step of the process in which photoresist is deposited across the structure and patterned as shown in the Figure. Note that by leaving the photoresist on the sidewalls of the silicon dioxide as illustrated, openings are provided to enter to introduce p-conductivity type dopant, such as boron, as illustrated in FIG. 6-12.

Figure 613:
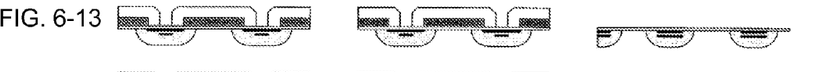
Figure 614:
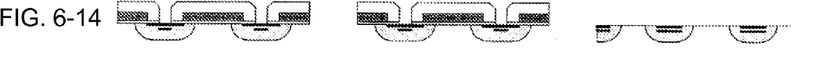

Following the boron implantation, the exposed polysilicon is etched away from the ring region. See FIG. 6-13. Then the underlying silicon dioxide is removed from the thereby exposed regions to result in the structure shown in FIG. 6-14.

Figure 615:
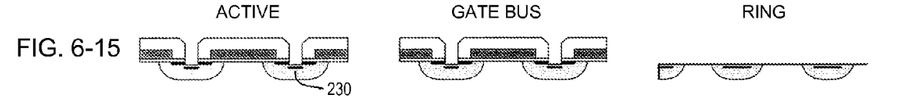
Figure 616:
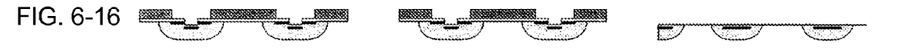

Next, the exposed n-conductivity type silicon substrate is lightly etched, preferably using a dry etching process to create shallow trenches 230 in the p-conductivity type regions, as illustrated by FIG. 6-15. The photoresist is then removed as shown by FIG. 6-16.

Figure 617:
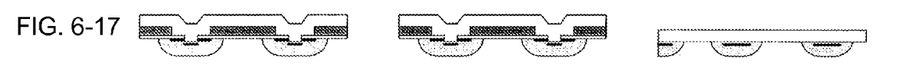
Figure 618:
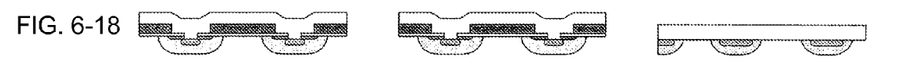

Following this step, as shown by FIG. 6-17, a layer of insulating material, such as silicon oxide, is deposited across the upper surface of the wafer. As shown by FIG. 6-18, an annealing operation is then performed to smooth the insulating material and more uniformly drive in the n-conductivity type and p-conductivity type impurities earlier introduced into the wafer.

Figure 619:
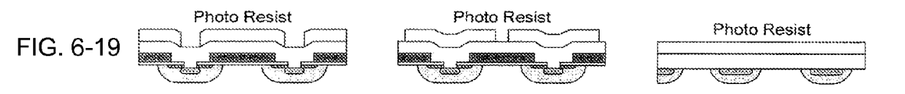
Figure 620:
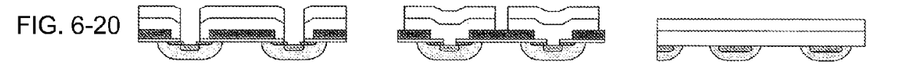
Figure 621:
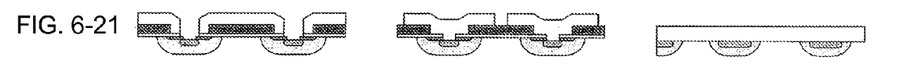

As shown by FIG. 6-19, a photoresist mask 240 is then defined across the upper surface of the wafer, to establish locations for the metal contacts to the underlying semiconductor device. Then, the underlying insulating layer is etched as shown in FIG. 6-20, and following that step, the photoresist layer is removed as illustrated in FIG. 6-21.

Figure 622:
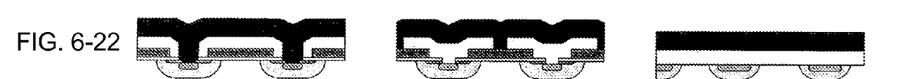
Figure 623:
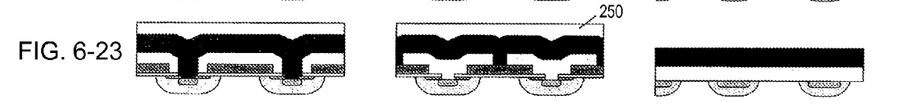
Figure 624:
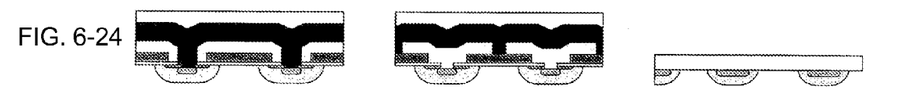
Figure 625:
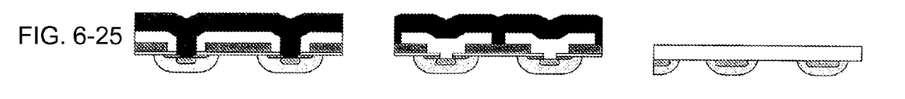
Figure 710:
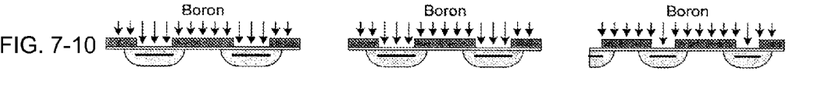
Figure 711:
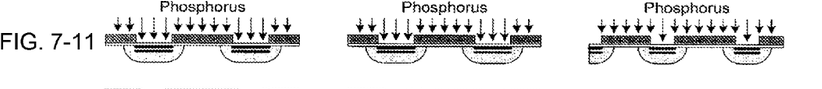
Figure 712:
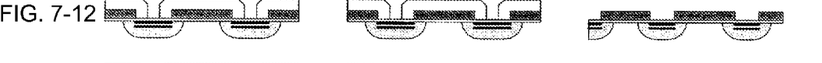
Figure 713:
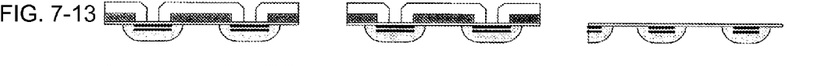
Figure 714:
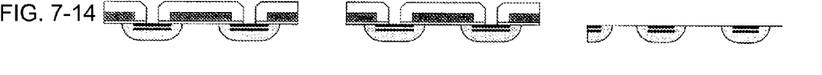
Figures 715, 716:
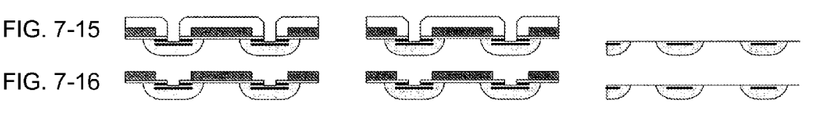
Figure 717:
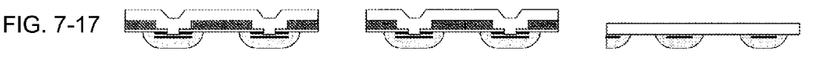
Figure 718:
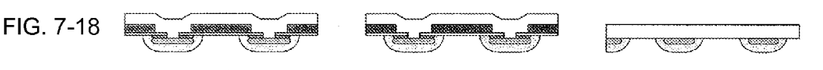
Figure 719:
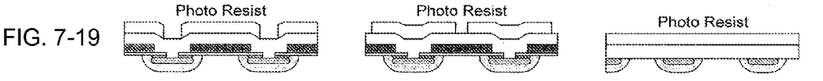
Figure 720:
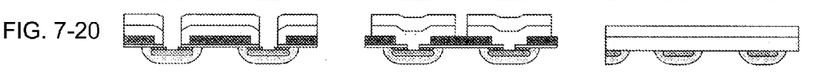
Figure 721:
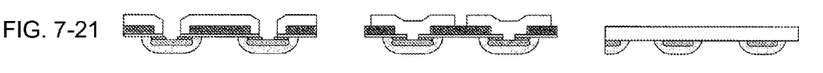
Figure 722:
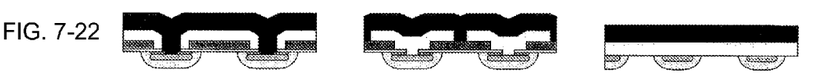
Figure 723:
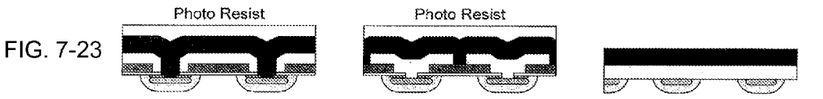
Figure 724:
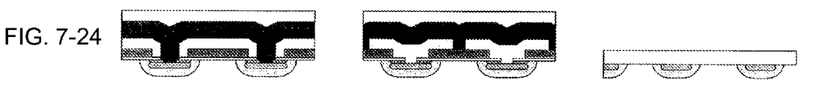
Figure 725:
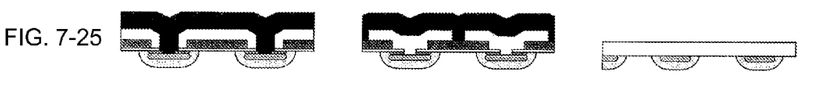

A metal suitable for forming electrical contacts is then deposited across the entire surface of the wafer as shown in FIG. 6-22. Then, a photomask 250 is deposited and used to define the desired locations where metal contacts are to be remain on the surface of the wafer. The remaining metal is illustrated in FIG. 6-24, and following that operation, the photoresist is removed, as shown in FIG. 6-25.

The process steps shown in FIG. 6 are particular advantageous as they required two fewer masks then the conventional process illustrated in FIG. 5. In addition, the implementation depicted in FIGS. 6 requires only two masks to be precisely aligned with respect to each other, as opposed to three precise alignment steps in the prior art.

Unlike the typical process, the junction termination rings are defined by the polysilicon mask. The multipurpose mask eliminates the unnecessary polysilicon layers in the junction termination area. Also unlike the typical process, the strongly doped n-conductivity type regions are implanted without a mask. With the multipurpose mask, the unnecessary strongly doped n-conductivity type etched from the top of the silicon. As also shown by FIG. 6 the strongly doped p-conductivity type regions are implanted with the multipurpose mask. Thus, the multipurpose mask replaces three masks from the typical fabrication process.

The resulting shape of the power device is slightly different from the typical process. By using a shorter diffusion time (or temperature) the bottom of the p-well remains relatively flat. This has the advantage of providing higher breakdown voltage. The metal contact in the active area has a stair-step shape at the edge of the strongly doped n-conductivity source region. In this example, the well in the gate bus line has a strongly doped n-conductivity type source which is not directly connected to metal. Because of the distance from the n-type region and the gate bus line to the contact in the active area, the strongly doped n-type layer has a resistance which suppresses parasitic NPN bipolar transistor turn on.

One disadvantage of the structure resulting from the process of FIG. 6 is that under the strongly doped n-conductivity type source there is a low density of p-conductivity type dopant. This can be overcome using the alternative process shown in FIG. 7.

The steps illustrated in FIG. 7 correspondent those shown in FIG. 6 up through FIG. 7-9. In contrast to FIG. 6, however, at FIG. 7-10 the boron implantation is performed without a mask. Compare FIG. 7-10 with FIG. 6-12. The result is that the final shape of the device shown in FIG. 7-25 has a strongly doped p-conductivity type layer under the whole of the strongly doped n-conductivity type layer. Because resistance of the strongly doped p-type layer is low, the parasitic NPN turn on voltage is strongly suppressed. But, because the p-type doping concentration under the gate oxide near the source end is slightly affected by the strongly doped p-type layer, the threshold voltage distribution is enhanced.

What is claimed is:

1. A process for fabrication of a power semiconductor device, comprising:
depositing a single photomask on a layer of polysilicon on a wafer;
removing the polysilicon layer from first regions of the power semiconductor device where p-conductivity type well regions and n-conductivity type source regions are to be formed;
introducing a p-conductivity type dopant into the wafer through the first regions to form the p-conductivity type well regions;
removing the single photomask;
introducing an n-conductivity type dopant into the wafer through the first regions to form the n-conductivity type source regions;
forming a multipurpose photomask on the wafer to overlie regions of the polysilicon layer which remain on the wafer, the polysilicon layer having an upper surface and having sidewalls, the multipurpose photomask overlying both the upper surface and the sidewalls, but leaving portions of the wafer exposed between the sidewalls;
implanting p-conductivity type impurity through the portions of the wafer exposed between the sidewalls to form p-conductivity type impurity regions within the p-conductivity type well regions; and
etching the wafer at locations where the portions of the wafer are exposed between the sidewalls to form recesses reaching toward the p-conductivity type impurity regions, wherein the etching of the wafer occurs after the implanting of the p-conductivity type impurity.

2. The process of claim 1, further comprising:
depositing a layer of insulating material over the surface of the wafer; and
depositing a layer of metal over the layer of insulating material.

3. The process of claim 2, further comprising:
etching metal to define electrical contacts to the power semiconductor device.

4. The process of claim 3, wherein the power semiconductor device is a vertical power MOSFET.

5. The process of claim 3, wherein the power semiconductor device is an insulated gate bipolar transistor.

6. The process of claim 1, wherein the process for fabrication of the power semiconductor device involves no more than four photomasks.

7. A process for making a power semiconductor device comprising:
on a substrate comprising an n-conductivity type semiconductor, forming a layer of gate oxide;
introducing n-conductivity type dopant into the substrate through the gate oxide;
depositing a layer of polycrystalline silicon on the gate oxide;
masking the layer of polycrystalline silicon to define first locations for introduction of impurities;
implanting p-conductivity type impurity into the first locations to provide p-wells in the substrate;
implanting n-conductivity type impurity into the first locations to provide source regions;
providing a masking layer over an upper surface of the layer of polycrystalline silicon and over exposed sidewalls of the layer of polycrystalline silicon to thereby define second locations within the first locations;
introducing p-conductivity type impurity into the second locations to form p-conductivity type impurity regions within the p-wells; and
performing a shallow etch of the substrate through the second locations to form recesses reaching toward the p-conductivity type impurity regions within the p-wells, wherein the performing of the shallow etch of the substrate occurs after the introducing the p-conductivity type impurity into the second locations.

8. The process of claim 7, further including:
depositing a layer of insulating material over the layer of polysilicon; and
annealing the layer of insulating material to cause smoothing of the layer of insulating material and diffusion of the n-conductivity type and p-conductivity type impurities into the substrate.

9. The process of claim 7, further comprising providing metal connections to the recesses reaching toward the p-conductivity type impurity regions within the p-wells.

10. The process of claim 9, wherein the power semiconductor device is a vertical power MOSFET.

11. The process of claim 9, wherein the power semiconductor device is an insulated gate bipolar transistor.

12. The process of claim 7, wherein the process for making the power semiconductor device involves no more than four photomasks.

13. A method of manufacturing a power semiconductor device comprising:
- (a) forming a layer of gate oxide on a substrate, wherein the substrate comprises an n-conductivity type semiconductor;
- (b) implanting an n-conductivity type dopant into the substrate through the gate oxide;
- (c) depositing a layer of polycrystalline silicon onto the gate oxide;
- (d) depositing a first layer of photoresist onto the layer of polycrystalline silicon thereby defining a plurality of exposed regions;
- (e) etching the layer of polycrystalline silicon at each of the plurality of exposed regions;
- (f) implanting a p-conductivity type dopant into the plurality of exposed regions;
- (g) etching the first layer of photoresist deposited in (d);
- (h) heating the substrate to drive the p-conductivity type dopant deeper into the substrate thereby forming a plurality of p-conductivity type wells;
- (i) implanting an n-conductivity type dopant into the p-conductivity type wells:
- (j) depositing a second layer of photoresist onto the layer of polycrystalline silicon and portions of the substrate, wherein the layer of polycrystalline silicon has an upper surface and a plurality of sidewalls, and wherein the second layer of photoresist overlies both the upper surface and the sidewalls, and wherein portions of the substrate between the sidewalls that are exposed through the second layer of photoresist;
- (k) implanting p-conductivity type dopant through the portions of the substrate between the sidewalls that are exposed through the second layer of photoresist to form p-conductivity type dopant regions; and
- (l) etching the portions of the substrate between the sidewalls that are exposed through the second layer of photoresist to form recesses reaching toward the p-conductivity type dopant regions, wherein the etching of the substrate of (l) occurs after the implanting of the p-conductivity type dopant of (k).

14. The method of claim 13, further comprising:
- (m) depositing a layer of insulating material onto the layer of polycrystalline silicon and portions of the substrate; and
- (n) depositing a layer of metal over the layer of insulating material.

15. The method of claim 14, further comprising:
- (o) etching the layer of metal deposited in (n) to define electrical contacts to the power semiconductor device.

16. The method of claim 13, wherein the depositing of the first layer of photoresist in (d) forms a photomask, and wherein the power semiconductor device is manufactured using no more than four photomasks.

17. The method of claim 13, wherein the power semiconductor device is an Insulated Gate Bipolar Transistor (IGBT).

18. The method of claim 13, wherein the power semiconductor device is a vertical power Metal Oxide Semiconductor Field Effect Transistor (MOSFET).

* * * * *